United States Patent [19]

Hashimoto et al.

[11] Patent Number: 5,320,979
[45] Date of Patent: Jun. 14, 1994

[54] METHOD OF CONNECTING WIRINGS THROUGH CONNECTION HOLE

[75] Inventors: Chisato Hashimoto, Sagamihara; Katsuyuki Machida, Isehara; Hideo Oikawa, Koganei, all of Japan

[73] Assignee: Nippon Telegraph and Telephone Corporation, Tokyo, Japan

[21] Appl. No.: 101,780

[22] Filed: Aug. 3, 1993

Related U.S. Application Data

[63] Continuation of Ser. No. 887,595, May 20, 1992, abandoned, which is a continuation of Ser. No. 622,328, Nov. 27, 1990, abandoned, which is a continuation of Ser. No. 545,754, Jun. 28, 1990, abandoned, which is a continuation of Ser. No. 221,715, Jul. 20, 1988, abandoned.

[30] Foreign Application Priority Data

Jul. 20, 1987 [JP] Japan ............................. 62-178977
Jul. 27, 1987 [JP] Japan ............................. 62-185384

[51] Int. Cl.$^5$ ....................... H01L 21/441; C23F 1/00
[52] U.S. Cl. .................................... 437/192; 437/195; 437/947; 437/981; 156/644
[58] Field of Search ............... 437/190, 192, 193, 195, 437/235, 947, 981, 985; 156/644

[56] References Cited

U.S. PATENT DOCUMENTS 4,624,740 11/1986 Abrams et al. ...................... 156/643

FOREIGN PATENT DOCUMENTS 58-48939  3/1983 Japan .
59-84561  4/1984 Japan .
60-227443 11/1985 Japan .

OTHER PUBLICATIONS

Chemical Abstracts 98(24):208315n; 103(10):80283c; (Dec. 1985) 101(20):181210r: 110(4):32424x; (Jun. 1988) 113(10):89050p (Aug. 1990).

Primary Examiner—John S. Maples
Attorney, Agent, or Firm—Blakeley, Sokoloff, Taylor & Zafman

[57] ABSTRACT

A method includes the steps of forming an insulating layer on a first conductive layer, forming a connection hole in the insulating layer, performing etching using an ion having a very low etching rate with respect to the first conductive layer and a high etching rate with respect to the insulating layer, thereby forming a taper on a side wall of the connection hole, and forming a second conductive layer on the first layer and the insulating layer. A typical example of an etching ion is an oxygen ion.

4 Claims, 7 Drawing Sheets

METHOD OF CONNECTING WIRINGS THROUGH CONNECTION HOLE

This is a continuation of U.S. patent application Ser. No. 07/887,595, filed May 20, 1992, now abandoned, which is a continuation of U.S. patent application Ser. No. 07/622,328, filed Nov. 27, 1990, now abandoned, which is a continuation of U.S. patent application Ser. No. 07/545,754, filed Jun. 28, 1990, now abandoned, which is a continuation of U.S. patent application Ser. No. 07/221,715, filed Jul. 20, 1988, now abandoned.

BACKGROUND OF THE INVENTION

The present invention relates to a method of connecting wirings through a connection hole.

Recently, as the packing density of LSIs is increased, a demand has arisen for a smaller contact hole for connecting a semiconductor substrate with a wiring layer or a smaller through hole for connecting a lower wiring with an upper wiring (such a contact hole and a through hole are called connection holes). Meanwhile, an insulating interlayer for insulating the upper wiring from the lower wiring cannot be formed thinner than a predetermined thickness in order to prevent dielectric breakdown and therefore must normally have a thickness of about 0.5 m or more. Therefore, an aspect ratio (connection hole depth/connection hole diameter) of a connection hole has been increased.

In addition, in order to arrange elements with high packing density, multi-layered wirings of two or more layers must be formed. Therefore, in order to form fine multi-layered wirings with high accuracy, the surface of the insulating interlayer must be flattened. In this case, a variety of elements are formed on the surface of a semiconductor substrate and hence the surface normally has undulations. Therefore, if the insulating interlayer is formed flat on the surface and connection holes are formed therein, the depths of the connection holes become different in correspondence to the underlying undulations.

For this reason, the manufacturing yield and reliability of the fine multi-layered wirings are degraded mainly by (1) an increase in the aspect ratio and (2) the presence of the contact holes having different depths.

That is, a wiring layer is normally formed by depositing a metal such as Al and Mo on the entire surface of a substrate by sputtering and then performing lithography and etching. However, if a side wall of a connection hole is vertical, a burying rate (deposited film thickness in connection hole/deposited film thickness on flat surface) is abruptly reduced when the aspect ratio is increased close to 1, as shown in FIG. 9. Therefore, if the insulating interlayer cannot be formed thin, a metal cannot be sufficiently deposited in a connection hole when a connection hole diameter becomes smaller than a predetermined value, thereby disconnecting the wiring layer.

In order to solve the above problem, a method of tapering a side wall of a connection hole is proposed.

A simplest tapering method is a method of opening a connection hole by wet etching. This method will be described with reference to FIGS. 10A to 10C wherein through holes are formed.

In FIG. 10A, an Al wiring 2 is formed on a semiconductor substrate 1 having a step 1a on its surface, and an $SiO_2$ layer 3 having a flat surface is formed thereon by a known bias sputtering method or etch-back method.

In FIG. 10B, a resist layer 7 is patterned by normal lithography to form a contact hole pattern. In FIG. 10C, through holes 4 and 4' having different depths are formed by wet etching using a buffer hydrofluoric acid solution are the resist layer 7 as an etching mask. As is apparent from the shape of the through hole 4, since wet etching is isotropic etching, a taper angle 5 is about 45°. Therefore, a pattern conversion difference (a pattern size difference between a resist layer 7 and an $SiO_2$ layer 3) becomes about twice a depth on an upper surface of the through hole.

Meanwhile, since the shallow through hole 4' is dipped in the etching solution until the deep through hole 4 is formed, the pattern conversion difference is increased even on the bottom surface of the through hole. In addition, in wet etching, the etching rate largely varies in a wafer. Therefore, in order to completely form through holes on the entire wafer surface, overetching must be performed. As a result, the conversion difference is further increased.

Another method of tapering a side wall of a connection hole is a method utilizing reactive ion etching (RIE) as dry etching. An example of this method is disclosed in Japanese Patent Laid-Open No. 58-93237. In this case, a substrate is processed following the same procedures as in FIGS. 10A and 10B, and then the $SiO_2$ layer 3 is etched by anisotropic etching as shown in FIG. 10D. After connection holes 4 and 4' having substantially vertical side walls are formed, the resist 7 is removed, and then RIE is performed on the entire surface using a gas mixture of $C_3F_8$ and $H_2$. In this case, if conditions are selected such that a polymer is deposited on a flat portion and etching progresses at upper end corner portions of the connection holes, etching is not performed on portions other than the connection holes, and therefore only the connection holes are tapered as shown in FIG. 10E. However, in this method, since polymerization and etching are used at the same time, the following problems are posed.

That is, in this method, characteristics of polymerization and etching largely depend on environments. More specifically, conditions of polymerization are changed in accordance with the type of an apparatus, the history of an apparatus, a loading effect, the size and the density of a pattern, and the like. For this reason, a complex process is required to set the conditions, and uniformity and reproducibility are degraded.

In addition, since the polymer is deposited on the flat surface, contamination caused by carbon (C) or the like may occur.

Therefore, using the above conventional methods, a side wall of a connection hole cannot be tapered at an arbitrary angle and the pattern conversion difference on the connection hole bottom surface cannot be eliminated. Even if these conditions are satisfied, a semiconductor device having a high manufacturing yield and reliability cannot be obtained.

In order to prevent disconnection of a wiring layer, a selective growth method of tungsten (W) is proposed.

This method utilizes a reaction in which tungsten is grown on only a conductive layer but not grown on an insulating layer in a certain gas atmosphere within a certain temperature range. The gas atmosphere is obtained by a gas mixture of $WF_6$ and $H_2$, and the temperature is normally about 300° C. Manufacturing steps of this selective growth method used to bury a contact hole will be described below with reference to FIGS. 11A to 11D.

In FIG. 11A, an SiO$_2$ layer 2 is formed on an Si (silicon) substrate 1 by a normal CVD or sputtering method. Then, as shown in FIG. 11B, a connection hole 4 is formed in the SiO$_2$ layer 2 by lithography and etching. Thereafter, as shown in FIG. 11C, tungsten 14 is selectively grown in the connection hole 4.

At this time, since selectively-grown tungsten 14 has a grain size of several thousands Å, undulations of about 1,000 Å are formed on its surface. In addition, selective growth of tungsten is very sensitive to a surface condition of a substrate on which the tungsten is to be grown. Therefore, in consideration of difficulty in controlling a film thickness, in order to prevent electrical short-circuit which occurs when tungsten in one connection hole overflows and contacts tungsten selectively grown in an adjacent connection hole, an average grown film thickness of tungsten must be about 80% or less of a depth of the connection hole. Thereafter, as shown in FIG. 11D, a metal layer 17 is deposited by a normal sputtering method to form a wiring layer by normal lithography and etching.

In this method, the wiring layer 17 must sufficiently cover the tungsten 14 in the connection hole 4. However, since the aspect ratio is increased in a recess of the tungsten 14, the wiring layer 17 cannot have a sufficient film thickness, and therefore a wiring resistance is largely increased at this portion. In the worst case, disconnection occurs. Therefore, the tungsten selective growth method is not sufficient to form fine multi-layered wirings with a high yield and reliability. Furthermore, since connection holes having different depths are present as described above, the above problems become more serious.

SUMMARY OF THE INVENTION

It is, therefore, a principal object of the present invention to increase, when a multi-layered wirings are to be connected through connection holes, a burying rate of the connection holes with respect to an upper wiring higher than a conventional burying rate to prevent an increase in wiring resistance or disconnection, thereby providing a method of connecting wirings through connection holes with a high manufacturing yield and reliability.

In order to achieve the above object, according to an aspect of the present invention, there is provided a method of connecting wirings through a connection hole, comprising the steps of forming a first conductive layer, forming an insulating layer on the first conductive layer, forming a connection hole in the insulating layer, performing etching using an ion having a very low etching rate with respect to the first conductive layer and a high etching rate with respect to the insulating layer, thereby forming a taper on a side wall of the connection hole, and forming a second conductive layer on the first conductive layer and the insulating layer.

DETAILED DESCRIPTION OF THE PREFERRED EMBODIMENTS

Figure 1A:
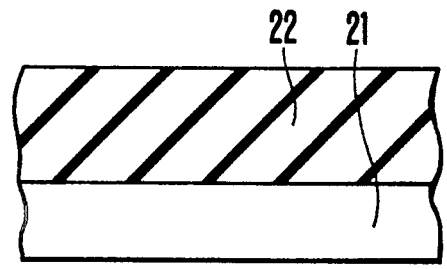
FIGS. 1A to 1E are sectional views showing an embodiment of a method of connecting wirings through connection holes according to the present invention.
Figure 1B:
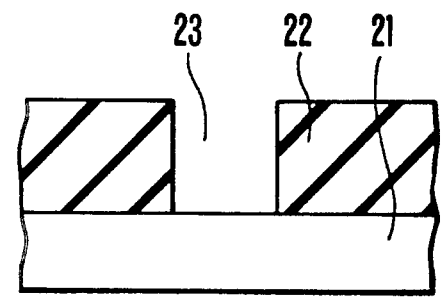
Figure 1C:
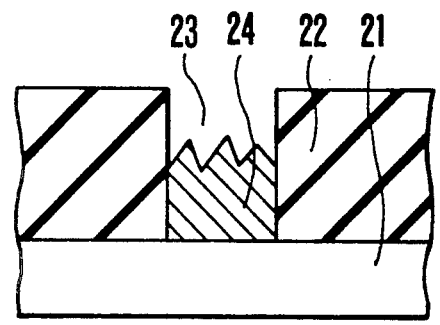
Figure 11A:
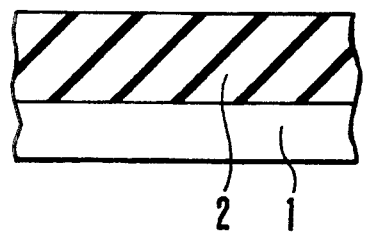
Figure 11B:
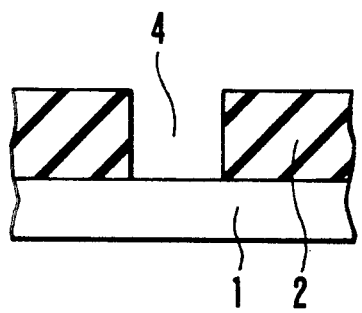
Figure 11C:
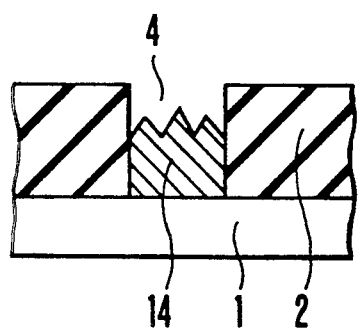
Figure 11D:
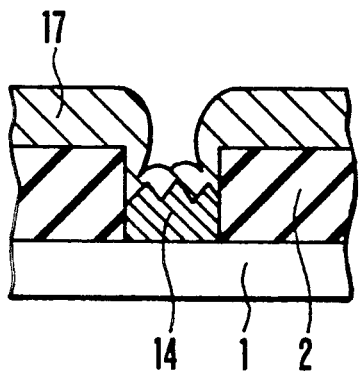

FIGS. 1A to 1E show an embodiment of a method of connecting wirings through connection holes according to the present invention. In this embodiment, an Si substrate is used as a first conductive layer, and a second conductive layer is formed on the Si substrate through a connection hole, i.e., a contact hole. First, as shown in FIG. 1A, an SiO$_2$ layer 22 is formed on an Si substrate 21 serving as a first conductive layer by a normal CVD or sputtering method. Then, as shown in FIG. 1B, a contact hole 23 is formed in the SiO$_2$ layer 22 by lithography and etching. Thereafter, as shown in FIG. 1C, tungsten 24 is selectively grown as a metal column in the contact hole 23 to be thinner than a depth of the contact hole 23. Note that the above steps are the same as the conventional steps shown in Figs. 11A to 11C.

Figure 1D:
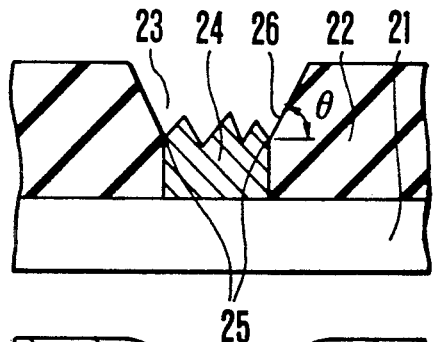

Then, after the above steps, a taper 26 is formed on a side wall of the contact hole 23 upward from a point 25 contacting an upper surface of the tungsten 24 using selective sputter etching by oxygen ions to be described later, as shown in FIG. 1D. At this time, an angle $\theta$ of the taper 26 can be controlled to be an arbitrary value within the range of $0° \theta < 90°$. Therefore, in order not to excessively increase a hole diameter at the upper end of the contact hole 23 with respect to that at its lower end, the angle $\theta$ of the taper 26 may be increased. Meanwhile, if the aspect ratio of the hole left on the tungsten 24 is so large as to cause disconnection of an upper wiring, the angle $\theta$ of the taper 26 may be reduced.

Figure 2:
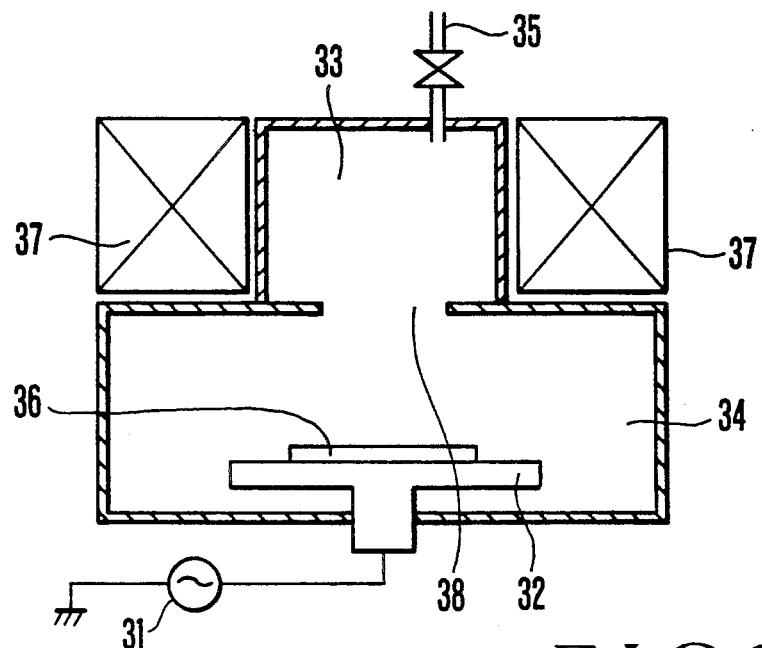
FIG. 2 is a schematic view showing an embodiment of a bias ECR etching apparatus used in the embodiment in FIG. 1.

In this case, in order to generate oxygen ions to form the taper 26 shown in FIG. 1D, a bias ECR (ELECTRON CYCLOTRON RESONANCE) etching method is used, and an apparatus therefore will be described below with reference to FIG. 2. In FIG. 2, a substrate electrode 32 connected to an RF bias power source 31 is disposed at a lower central portion in a sample chamber 34, and a sample substrate 36 is disposed thereon. A plasma generating chamber 33 is located above and adjacent to the sample chamber 34, and a window 38 is formed between the plasma generating chamber 33 and the sample chamber 34 so as to oppose the sample substrate 36. A gas supply mechanism 35 is formed above the plasma generating chamber 33 to supply an etching gas such as O$_2$ gas or Ar gas. A magnet coil 37 is disposed around the plasma generating chamber 33 to efficiently transport ions generated in the plasma generating chamber 33 by a magnetic field to the sample chamber 34. In order to generate ions in the plasma generating chamber 33, a microwave electron cyclotron resonance method is used. According to such a bias ECR etching apparatus, an oxygen plasma can be generated at a high vacuum pressure of $10^{-4}$ to $10^{-5}$ Torr. Therefore, a generation efficiency of oxygen ions is high and oxygen ions are further accelerated by applying an RF bias voltage to the substrate electrode 32. As a result, high-speed sputter etching by oxygen ions can be performed on the sample substrate 36.

Figure 3:
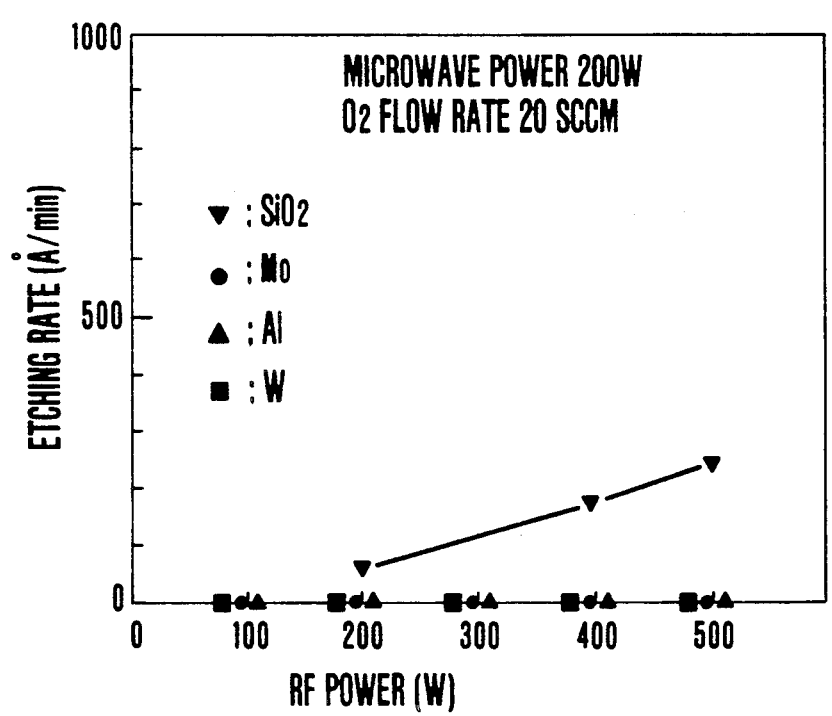
FIG. 3 is a graph showing an RF power dependency of a sputter etching rate by oxygen ions obtained when the bias ECR etching apparatus in FIG. 2 is used.

A difference between etching characteristics of an insulating material and a conductive material obtained by oxygen ions when the bias ECR etching apparatus is used will be described below. FIG. 3 shows RF power dependencies of etching rates of $SiO_2$, Mo, W, and Al obtained by oxygen ions when the bias ECR etching apparatus in FIG. 2 is used. In FIG. 3, the RF power is plotted along the abscissa, and the etching rate is plotted along the ordinate. As is apparent from FIG. 3, as the RF power is increased, the etching rate of $SiO_2$ is increased, but Mo, W, and Al are not etched. This is because although a metal surface is oxidized by oxygen ions, the surface of the formed metal oxide is oxygen. Therefore the metal is not etched unless the oxygen is sputter-etched by oxygen ions again. That is, the metal is not etched because the metal is immediately oxidized even if the oxygen is etched by sputtering.

Figure 4:
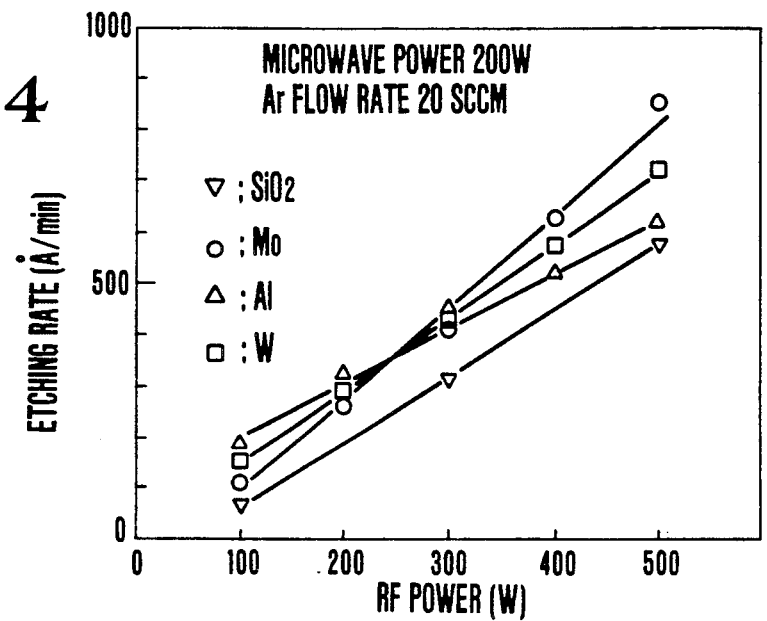
FIG. 4 is a graph showing an RF power dependency of a sputter etching rate by normal argon (Ar) ions.

Meanwhile, Ar ions used in normal sputter etching do not form a compound with a metal. Therefore, as shown in FIG. 4, although etching rates are slightly different, any of $SiO_2$, Mo, W, and Al is sputter-etched.

The reason why the tapered shape as shown in FIG. 1D is obtained by sputter etching using an $O_2$ gas will be described. First, the side wall of the contact hole 23 in FIG. 1C is tapered on the basis of a well-known incident angle dependency of a sputtering rate. That is, since etching ions are incident vertically on the sample substrate 26 in FIG. 2, the side wall of the contact hole 23 in FIG. 1C is not etched when the angle of the taper 26 in FIG. 1D is 90°.

However, an electric field is concentrated to an upper end corner portion of the contact hole 23. As a result, $SiO_2$ at the corner portion is sputter-etched to form a small tapered portion. When this small tapered portion is formed, formation of the taper 26 begins using the small tapered portion as a core.

Figure 5:
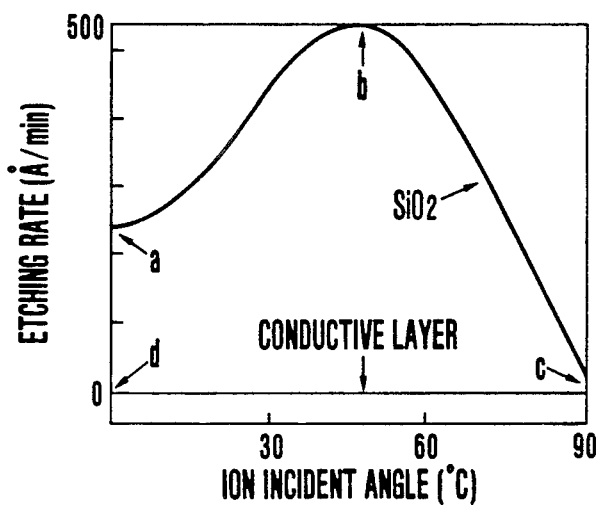
FIG. 5 is a graph showing an ion incident angle-etching characteristic.
Figure 6:
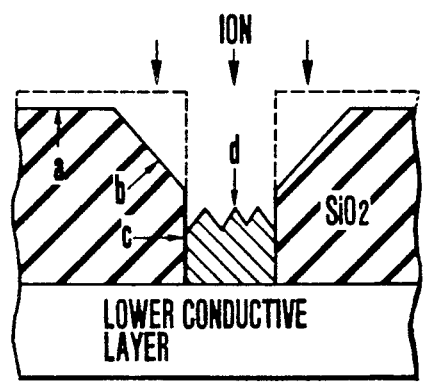
FIG. 6 is a sectional for explaining selective etching.

A relationship between an ion incident angle and an etching rate with respect to the $SiO_2$ layer 22 is well shown in FIG. 5. In FIG. 5, when the incident angle is 0°, the $SiO_2$ layer 22 is ion-etched at an etching rate indicated by arrow a. When the incident angle is 0°, ions are incident on a flat portion of the $SiO_2$ layer 22. Therefore, the flat portion is etched at a certain rate. When the taper is formed at the upper end corner portion of the contact hole 23, the ion incident angle at the portion is gradually increased, and the etching rate is increased. As is apparent from FIG. 5, the etching rate is highest at an incident angle of about 45°. Therefore, when ion etching is performed for a predetermined time, the $SiO_2$ layer 22 is etched from a state indicated by broken lines to a state indicated by solid lines in FIG. 6. Since the ion incident angle on the side wall of the contact hole 23 is 90°, the etching rate is reduced to be almost 0 as is shown at a portion indicated by c in FIG. 5, i.e., the side wall is almost not etched. In addition, the metal portion (tungsten 24) is almost not etched as is apparent from a portion d of the characteristic shown in FIG. 5. As a result, in FIG. 6, the tungsten 24 is almost not or not etched at all.

The taper 26 is formed from the point 25 at which the side wall of the contact hole 23 is in contact with the tungsten 24. As described above, the sputtering rate on the inclined surface (an angle of the taper 26 is larger than 0° and smaller than 90°) is higher than that on the flat surface (the angle of the taper 26 is 0°). In other words, since the etching rate is higher on the inclined surface, the angle $\theta$ of the taper 26 is reduced while a film thickness of the $SiO_2$ layer 22 is not reduced very much. At this time, it should be noted that a position of the point 25 of the taper 26 is almost not changed. Meanwhile, although the taper is formed when sputter etching is performed by Ar ions, the tungsten 24 in FIG. 1D is undesirably etched at the same time (FIG. 4). However, as in the above embodiment, when sputtering is performed by oxygen ions, the tungsten 24 is not etched.

Figure 1E:
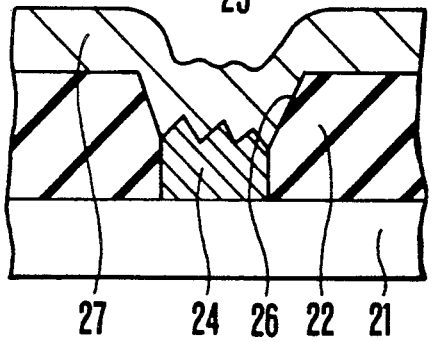

In this manner, when the taper 26 as shown in FIG. 1D is formed on the side wall of the contact hole 23 by selective sputter etching using oxygen ions, the tungsten 24 is not etched. Therefore, a position of the point 25 is not changed, and the angle $\theta$ of the taper 26 is changed from 90° to 0° with a slight film thickness decrease of the $SiO_2$ layer 22 on the flat surface. After the desired angle $\theta$ of the taper 26 is obtained in this manner, tungsten oxide formed on the surface of the tungsten 24 is removed by a normal reverse sputtering method or the like. At this time, the tungsten oxide can be easily removed because its film thickness is at most 200 Å. Then, as shown in FIG. 1E, the metal layer is deposited by a normal sputtering method or the like, and then the wiring layer 27 is formed as a second conductive layer by normal lithography and etching. As a result, the wiring layer 27 is conductively connected on the Si substrate 21 through the contact hole 23 including the tungsten 24. In this case, unlike in the conventional methods, since the taper 26 is formed on the side wall of the contact hole 23, the wiring layer 27 can have a sufficient film thickness in the contact hole 23 even if the aspect ratio is high. For this reason, an increase in electrical resistance or disconnection in the contact hole 23 of the wiring layer 27 can be prevented. Therefore, according to the present invention, a semiconductor apparatus having fine connection holes with high manufacturing yield and reliability can be obtained.

Note that in the above embodiment, tungsten is used as a metal column in a connection hole, but another metal such as Mo or Al may be used. In addition, a selective growth method is used as a deposition method of the metal, but another method such as a combination of a normal CVD method and etch-back may be used.

Furthermore, the bias ECR etching apparatus is used as an etching apparatus for forming a taper. However, a condition that an insulating film is etched by oxygen ions need only be satisfied. Therefore, it is a matter of course that an etching apparatus of another system not departing from this concept may be used.

In the above embodiment, oxygen ions are used as etching ions, but another type of ions may be used as long as the etching characteristics are different with respect to the insulating film and the metal or the conductive material.

In the above embodiment, two conductive layers are formed. However, the present invention is not limited to the above embodiment, and three or more conductive layers may be formed. When a connection hole in which a metal column need not be buried because its depth is small is present together with other connection holes, the metal column need not be buried in this connection hole but only a taper may be formed in the connection hole by etching using oxygen ions. That is, a connection hole not according to the present invention or a connection hole partially according to the present invention may be present together with the connection hole according to the present invention without posing any problem and without departing from the spirit and scope of the present invention.

Figure 7A:
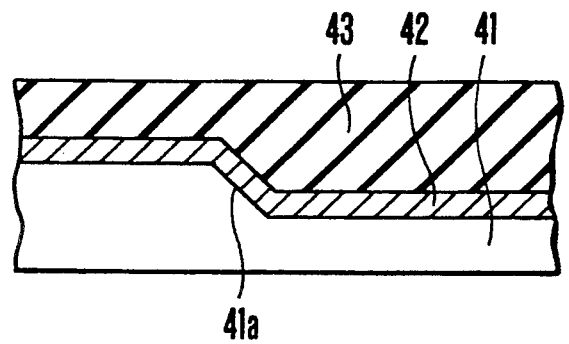
FIGS. 7A to 7D and 8A and 8B are sectional views showing another embodiment of the present invention.
Figure 7B:
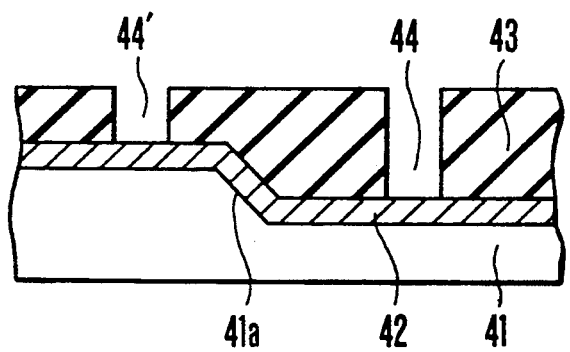
Figure 7C:
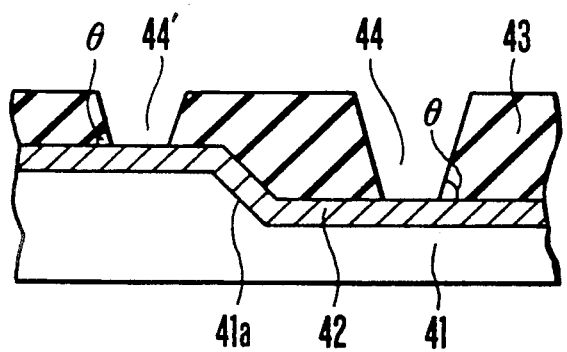

FIGS. 7A to 7D show another embodiment of the present invention in which the metal column described above is not buried. First, as shown in FIG. 7A, an Al wiring 42 is formed as a first conductive layer on a semiconductor substrate 41 having a step 41a on its surface, and an SiO₂ layer 43 is formed thereon as an insulating layer. Then, as shown in FIG. 7B, through holes 44 and 44' are formed as connection holes in the SiO₂ layer 43 by lithography and etching. Subsequently, as in the above embodiment, tapers are formed on side walls of the through holes 44 and 44' by selective sputter-etching using oxygen ions, respectively, as shown in FIG. 7C. In this case, the tapers are formed as in the above embodiment. That is, each of the contact holes 44 and 44' is gradually etched from its upper end corner portion to form a predetermined taper. A taper angle $\theta$ of the taper can be controlled to be an arbitrary value within the range of $0° < \theta < 90°$. Therefore, in order not to excessively increase a hole diameter at the upper end of each of the through holes 44 and 44' with respect to that at its lower end, the taper angle $\theta$ may be increased. Meanwhile, if an aspect ratio of the through holes 44 and 44' is large to cause disconnection of the upper wiring, the taper angle $\theta$ may be reduced.

Figure 7D:
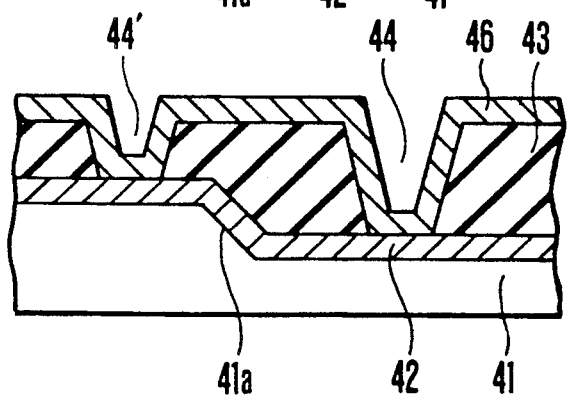

In this embodiment, the taper is formed from a point of the contact hole 44 contacting the first conductive layer 42. Therefore, the diameter of the contact hole 44' is slightly larger than that at the start of formation. As an apparatus for forming the taper, the bias ECR etching apparatus or the other known etching apparatuses are used. Then, as shown in FIG. 7D, a metal layer is deposited by a normal sputtering method or the like, and a wiring layer 46 as a second conductive layer is formed by normal lithography and etching. In this case, since the sufficient tapers are formed on the side walls of the through holes 44 and 44', the wiring layer 46 can have a sufficient film thickness in the through holes 44 and 44' even if the aspect ratio is high. Therefore, an increase in electrical resistance or disconnection in the through holes 44 and 44' of the wiring layer 46 is prevented. In this manner, a semiconductor apparatus with a high manufacturing yield and reliability and having connection holes with a high aspect ratio can be obtained without considering an increase in area caused by a pattern conversion difference.

Figure 8A:
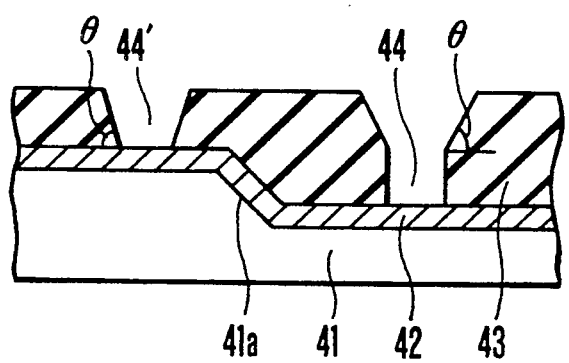
Figure 8B:
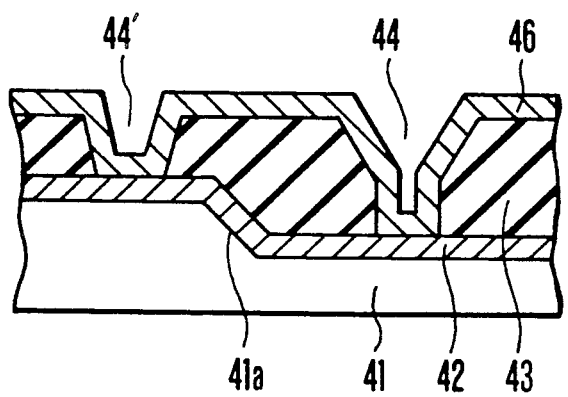
Figure 9:
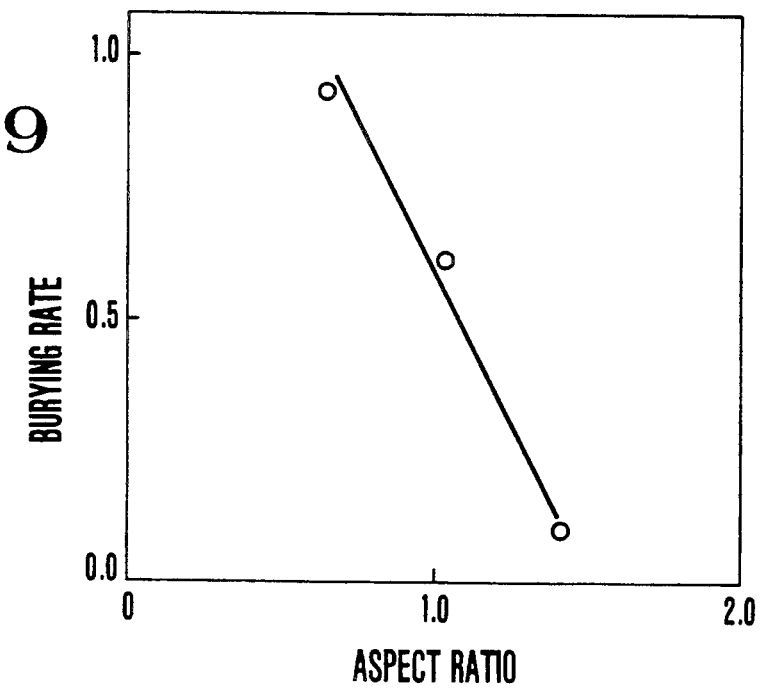
FIG. 9 is a graph showing an aspect dependency of a normal burying rate.
Figure 10A:
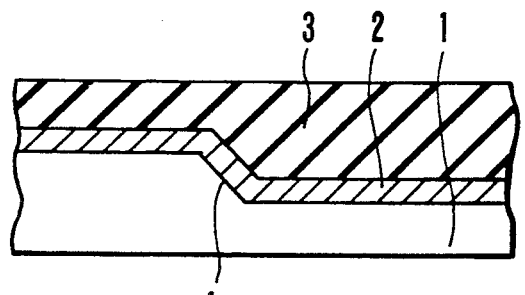
FIGS. 10A to 10E and 11A to 11D are sectional views showing conventional methods of connecting wirings through connection holes.
Figure 10B:
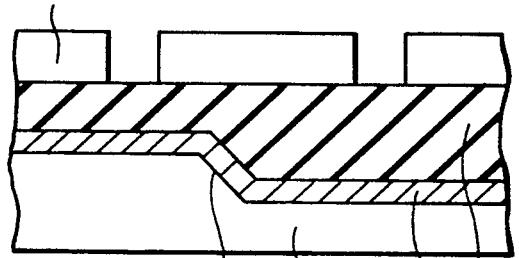
Figure 10C:
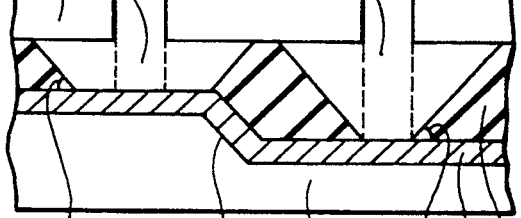
Figure 10D:
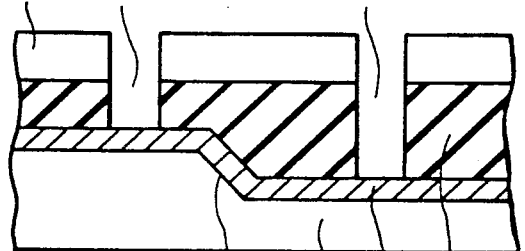
Figure 10E:
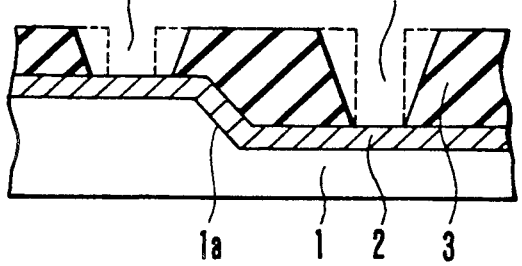

FIGS. 8A and 8B show a modification of the embodiment in FIGS. 7A to 7D, corresponding to FIGS. 7C and 7D. In this case, a taper is formed from a portion of a contact hole 44' contacting a first conductive layer 42.

Therefore, in the contact hole 44, the taper is formed upward from a middle portion of a side wall.

What is claimed is:

1. A method of connecting wirings through a connecting hole, comprising the steps of:
   forming a first conductive layer for a first wiring;
   forming an insulating layer on said first conductive layer;
   forming a connection hole having a bottom and a side wall on said first conductive layer;
   forming a metal column on the bottom of said connection hole;
   forming a taper on the side wall of said connection hole at least near a top of said insulating layer by physical etching with an oxygen ion only, a material of said ion having a characteristic which reacts with said metal column to form an oxide layer for protecting said metal column from etching so that an etching rate with respect to said metal column is lower than that with respect to said insulating layer; and
   forming a second conductive layer for a second wiring on said insulating layer, said metal column in said connection hole, and the side wall of said connection hole.

2. A method according to claim 1, wherein said metal column comprises tungsten aluminum or molybdenum.

3. A method of connecting wirings through a connecting hole, comprising the steps of:
   forming a first conductive layer for a first wiring;
   forming an insulating layer on said first conductive layer;
   forming a connection hole having a bottom and a side wall on said first conductive layer;
   forming a taper on the side wall of said connection hole at least near a top of said insulating layer by physical etching with an oxygen ion only, a material of said ion having a characteristic which reacts with said first conductive layer to form an oxide layer for protecting said conductive layer from etching so that an etching rate with respect to said first conductive layer is lower than that with respect to said insulating layer; and
   forming a second conductive layer for a second wiring on said insulating layer, said first conductive layer in said connection hole, and the side wall of said connection hole.

4. A method according to claim 3, wherein said first conductive layer comprises tungsten, aluminum or molybdenum.

* * * * *